United States Patent
Shim

(10) Patent No.: US 7,728,380 B2
(45) Date of Patent: Jun. 1, 2010

(54) SEMICONDUCTOR DEVICE

(75) Inventor: Jae Hwan Shim, Gyeonggi-do (KR)

(73) Assignee: Dongbu HiTek Co., Ltd, Seoul (KR)

( * ) Notice: Subject to any disclaimer, the term of this patent is extended or adjusted under 35 U.S.C. 154(b) by 210 days.

(21) Appl. No.: 11/616,280

(22) Filed: Dec. 26, 2006

(65) Prior Publication Data

US 2007/0145476 A1 Jun. 28, 2007

(30) Foreign Application Priority Data

Dec. 28, 2005 (KR) .................. 10-2005-0132715

(51) Int. Cl.
*H01L 21/336* (2006.01)
*H01L 29/76* (2006.01)
*H01L 29/94* (2006.01)

(52) U.S. Cl. .................. 257/330; 257/288; 257/328; 257/333; 257/396; 257/E21.384; 257/E21.41; 257/E21.419; 257/E29.321; 438/258; 438/259; 438/261; 438/270; 438/271

(58) Field of Classification Search .................. 257/288, 257/328, 330, 333, 396, E21.384, E21.41, 257/E21.419, E29.321; 438/258, 259, 261, 438/270, 271
See application file for complete search history.

(56) References Cited

U.S. PATENT DOCUMENTS

| 5,473,176 | A | * | 12/1995 | Kakumoto | .................. 257/192 |
| 6,642,130 | B2 | * | 11/2003 | Park | .......................... 438/589 |
| 6,916,745 | B2 | * | 7/2005 | Herrick et al. | .............. 438/700 |
| 7,259,411 | B1 | * | 8/2007 | Hopper et al. | .............. 257/288 |
| 7,368,778 | B2 | * | 5/2008 | Lee et al. | ..................... 257/306 |
| 2004/0224476 | A1 | * | 11/2004 | Yamada et al. | .............. 438/400 |

* cited by examiner

*Primary Examiner*—Dao H Nguyen
(74) *Attorney, Agent, or Firm*—Sherr & Vaughn, PLLC

(57) ABSTRACT

Embodiments relate to a semiconductor device. In embodiments, a semiconductor device may include a semiconductor substrate having isolation layers and a well region, a gate electrode formed within a trench having a predetermined depth in the well region, source/drain regions formed at both sides of the trench, an interlayer dielectric layer formed on the semiconductor substrate to have predetermined contact holes, and metal interconnections formed within the contact holes, respectively.

12 Claims, 6 Drawing Sheets

SEMICONDUCTOR DEVICE

The present application claims priority under 35 U.S.C. 119 and 35 U.S.C. 365 to Korean Patent Application No. 10-2005-0132715 (filed on Dec. 28, 2005), which is hereby incorporated by reference in its entirety.

BACKGROUND

Semiconductor devices, such as memory devices, image sensors, and the like, may be obtained by highly integrating a plurality of unit elements on a semiconductor substrate.

To highly integrate a plurality of unit elements on a semiconductor substrate, the respective unit elements may be stacked. Alternatively, metal interconnections may be required through which driving signals may be applied to drive the respective unit elements. Such metal interconnections may also be stacked as multiple layers by interlayer dielectric layers.

If unit elements are formed in the above manner and metal interconnections to drive the unit elements are arranged, the metal interconnections may be disconnected if a prescribed portion of an interlayer dielectric layer, in which the metal interconnections are stacked later, is not planarized.

For this reason, a CMP (Chemical Mechanical Polishing) process may be used to planarize the interlayer dielectric layer. The CMP process may not be able to completely planarize the interlayer dielectric layer. Accordingly, a defect may occur in the interconnection process.

FIG. 1 is an example sectional view showing a structure of a related art MOS transistor.

According to the related art MOS transistor, as shown in FIG. 1, active and field regions may be defined in semiconductor substrate 1 such that isolation layers 2 may be formed in the field region.

A gate, which may have gate insulating layer 3, gate electrode 4, and cap insulating layer 5 sequentially formed therein, may be formed on semiconductor device 1 in the active region.

Lowly concentrated n-type impurity regions (-n) 8a and 8b may be formed in semiconductor substrate 1 at both sides of the gate, for example by implanting impurities using the gate as a mask. Sidewall insulating layers 6 may be formed on both side surfaces of gate, respectively.

Source/drain regions 9, which may be highly concentrated n-type impurity regions, may be formed in semiconductor substrate 1 at both sides of the gate, for example by implanting impurities using the sidewall insulating layers and the gate as a mask.

The related art semiconductor device may have various problems. For example, since an interlayer dielectric layer may convexly protrude along a gate in a case where it may be formed on a top surface of a MOS transistor formed as described above, it may be difficult to planarize the interlayer dielectric layer.

Since an interlayer dielectric layer may not be planarized, a failure of a metal interconnection may be caused in a case where a metal interconnection is formed on the interlayer dielectric layer.

SUMMARY

Embodiments relate to a semiconductor device and a method of manufacturing the same.

Embodiments relate to a semiconductor device and a method of manufacturing the same in which a prescribed trench may be formed on a substrate and a gate stack (or a semiconductor device) may be formed within the trench, thereby planarizing an interlayer dielectric layer.

In embodiments, a semiconductor device may include a semiconductor substrate having isolation layers and a well region, a gate electrode formed within a trench having a prescribed depth in the well region, source/drain regions formed at both sides of the trench, respectively, an interlayer dielectric layer formed on the semiconductor substrate to have prescribed contact holes, and metal interconnections formed within the contact holes, respectively.

In embodiments, a method of manufacturing a semiconductor device may include forming first and second trenches in a semiconductor substrate, forming an insulating layer within the first and the second trenches, forming a well region within the semiconductor substrate, selectively removing the insulating layer formed within the second trench, thereby forming a third trench, forming a gate electrode within the third trench, forming source/drain regions within the well region, forming an interlayer dielectric layer on the semiconductor substrate, forming contact holes in the interlayer dielectric layer, and forming metal interconnections within the contact holes, respectively.

DETAILED DESCRIPTION OF EMBODIMENTS

Figure 1:
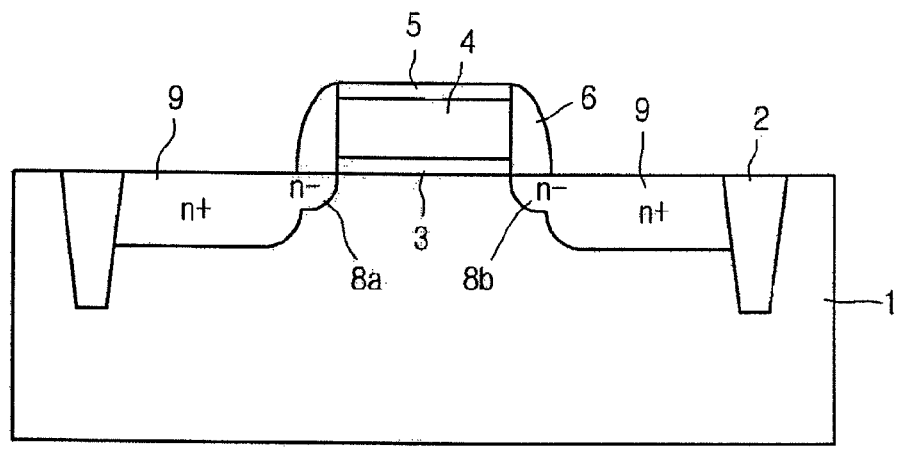
FIG. 1 is an example sectional diagram illustrating a structure of a related art MOS transistor.
Figure 2:
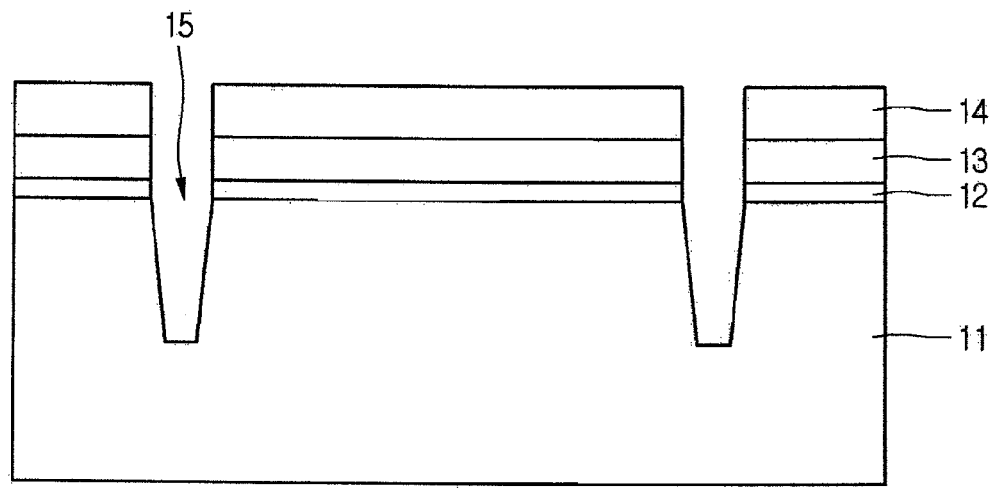
FIGS. 2 to 11 are example sectional diagrams illustrating a semiconductor device and a method of manufacturing a semiconductor device according to embodiments.

Referring to FIG. 2, pad oxidation layer 12 ($SiO_2$) may be formed on semiconductor substrate 11, and nitride layer 13 (SiN) may be deposited on pad oxidation layer 12.

Further, first photoresist 14 may be formed on nitride layer 13, and first photoresist 14 in the field region may be selectively removed by an exposing and developing process using a mask defining the active and field regions.

First trenches 15, which may be for device isolation, may be formed by etching nitride layer 13, pad oxidation layer 12, and the semiconductor substrate within the field region to a prescribed depth, for example using patterned first photoresist 14 as a mask. Further, first photoresist 14 may be removed.

Figure 3:
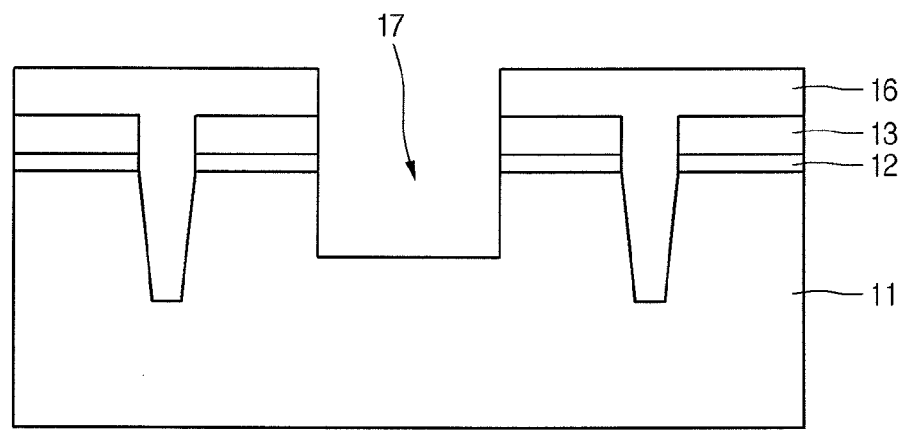

Referring to FIG. 3, second photoresist 16 may be deposited on a surface of semiconductor substrate 11 (for example the entire surface) having first trenches 15. Second photoresist 16 may be selectively removed by an exposing and developing process, for example using a mask defining a region in which a gate electrode may be formed in the active region.

Second trench 17 may be formed, for example by etching exposed nitride layer 13, pad oxidation layer 12, and semiconductor substrate 11 to a prescribed depth using patterned second photoresist 16 as a mask.

If first trench 15 is used to form a device isolation layer, second trench may be used to form a gate stack which will be described later, according to embodiments.

Further, second trench 17 may be formed with first trenches 15 at a prescribed interval.

Figure 4:
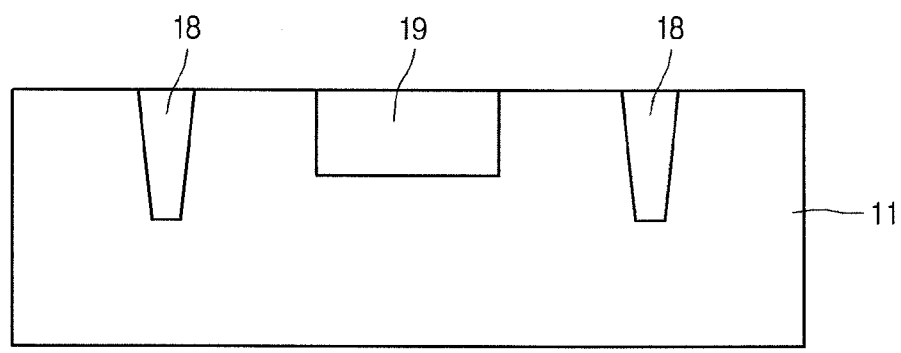

Referring to FIG. 4, second photoresist 16, nitride layer 13, and pad oxidation layer 12 may be removed, and an insulating layer such as an $O_3$ TEOS or HDP (High Density Plasma) oxidation layer may be deposited on a surface (for example, the entire surface) of semiconductor substrate 11 such that first and second trenches 15 and 17 may be filled with the insulating layer.

Isolation layers 18 may be formed within first trenches 15. Insulating layer pattern 19 may be simultaneously formed within second trench 17, for example by performing a CMP (Chemical Mechanical Polishing) process such that a surface of semiconductor substrate 11 may be exposed and the insulating layer may be left only within first and second trenches 15 and 17.

Figure 5:
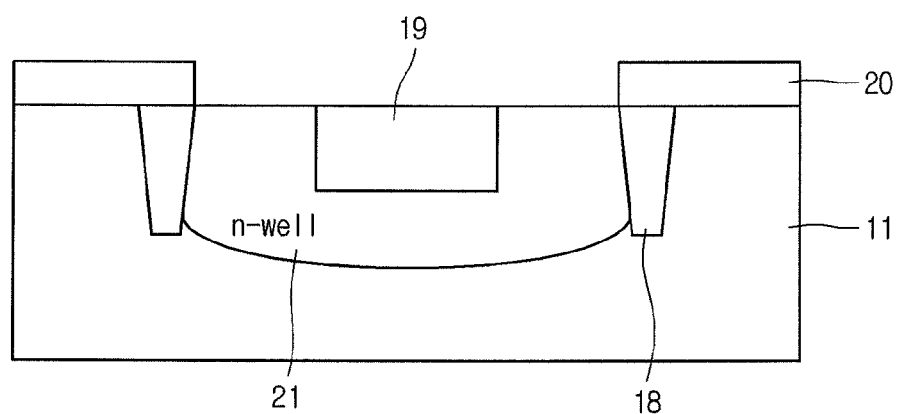

Referring to FIG. 5, third photoresist 20 may be coated on a surface (for example, the entire surface) of semiconductor substrate 11, and third photoresist 20 may be patterned to define a well region in the active region.

Further, n-well region 21 may be formed by implanting n-type impurity ions onto semiconductor substrate 11 using patterned third photoresist 20 as a mask and performing a diffusion process. According to embodiments, tilt ion implantation may be performed as the impurity ion implantation.

Figure 6:
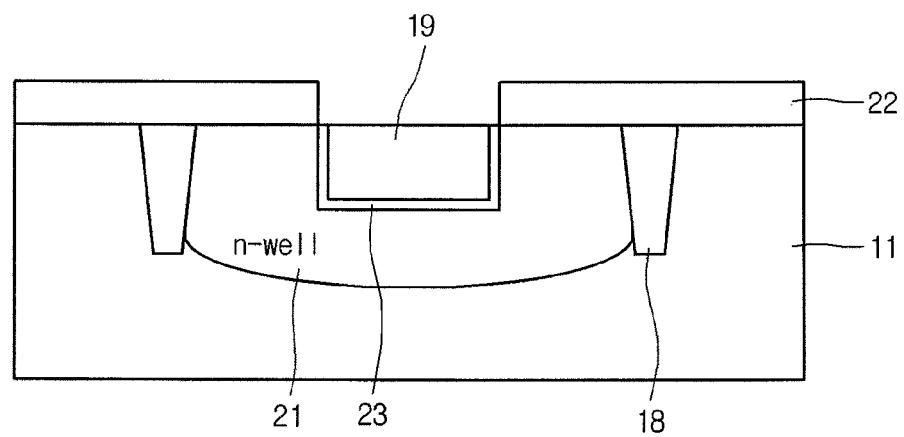

Referring to FIG. 6, third photoresist 20 may be removed, a fourth photoresist 22 may be coated on a surface (for example the entire surface) of semiconductor substrate 11. Fourth photoresist 22 may be patterned such that a portion of insulation pattern 19 may be exposed.

According to embodiments, fourth photoresist 22 may be patterned such that a portion of semiconductor substrate 11 may be exposed while insulating layer pattern 19 is exposed.

Further, highly concentrated n-type impurity region 23 may be formed in semiconductor substrate 11 to which insulating layer pattern 19 may be adjacent, for example by implanting highly concentrated n-type impurities ions onto semiconductor substrate 11 using patterned fourth photoresist 22 as a mask. In embodiments, a DDD (Double Doped Drain) structure may be formed. In embodiments, tilt ion implantation may be performed as the impurity ion implantation.

Accordingly, n-type impurity region 23 may be formed around insulating layer pattern 19, and a portion of n-type impurity region 23 may be exposed between fourth photoresists 22.

Figure 7:
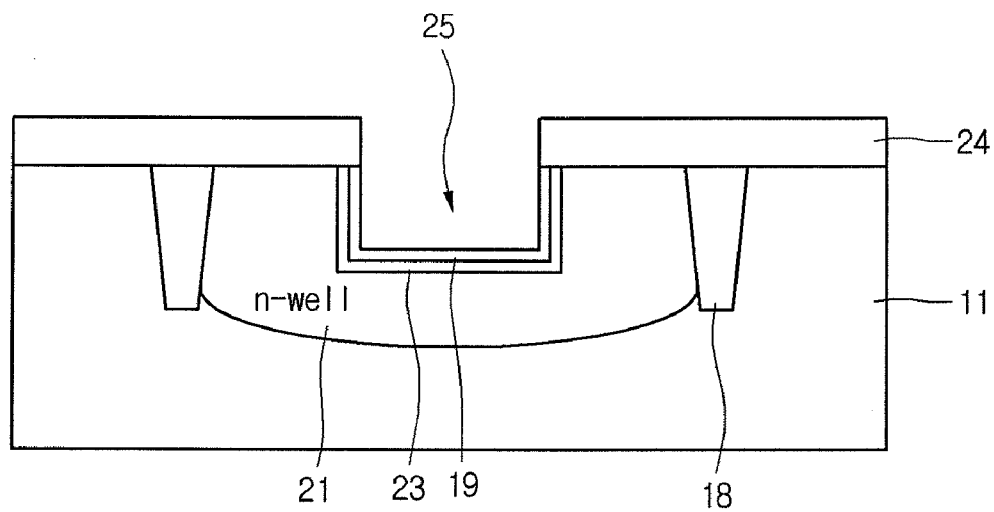

Referring to FIG. 7, fourth photoresist 22 may be removed. Fifth photoresist 24 may be coated on a surface and (for example, the entire surface) of semiconductor substrate 11. Fifth photoresist 24 may be patterned such that a portion thereof with a width narrower than that of insulating layer pattern 19 may be exposed.

In embodiments, fifth photoresist 24 may be patterned such that n-type impurity region 23 may not be exposed.

Further, third trench 25 may be formed within semiconductor substrate 11, for example by performing a process of selectively etching insulating layer pattern 19 using patterned fifth photoresist 24 as a mask.

According to embodiments, insulating layer 19 with a prescribed thickness may be left to remain on sidewall(s) and bottom surfaces of the second trench. N-type impurity region 23 may not be exposed because of insulating layer pattern 19 that remains after having been etched, and also because of fifth photoresist 24.

Insulating layer pattern 19, n-type impurity region 23, and n-well region 21 may thus be formed beneath third trench 25.

Further, insulating layer pattern 19 and the n-type impurity region 23 may be formed to the sides of third trench 25. N-well region 21 and source/drain regions 29 (that may be formed later) may be positioned on side surfaces of n-type impurity region 23.

Figure 8:
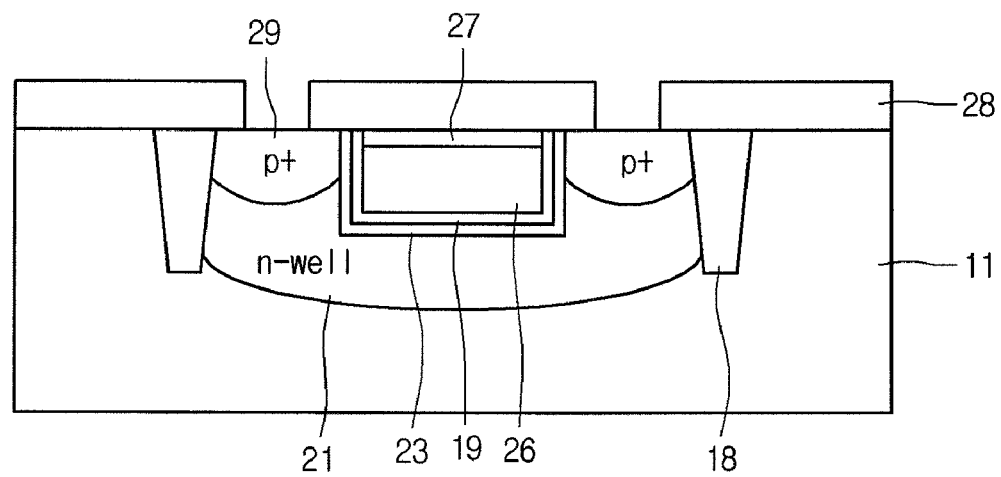

Referring to FIG. 8, fifth photoresist 24 may be removed. Gate electrode 26 and cap gate insulating layer 27 may be formed, for example, by depositing a polysilicon layer and an insulating layer on a surface (for example, the entire surface) of semiconductor substrate 11 such that third trench 25 may be filled with the polysilicon layer and the insulating layer. A CMP process may then be performed.

Accordingly, a gate stack, which may include gate electrode 26 and cap gate insulating layer 27, may be formed within semiconductor substrate 11.

In embodiments gate electrode 26 may be formed by not forming a cap gate insulating layer material but instead depositing only polysilicon.

Further, sixth photoresist 28 may be coated on a surface (for example, the entire surface) of semiconductor substrate 11 including gate electrode 26. Sixth photoresist 28 may be patterned such that semiconductor substrate 11 positioned at both sides of gate electrode 26 may be exposed.

Furthermore, source/drain regions 29 may be formed on n-well region 21 at both sides of gate electrode 26, for example by performing a process of implanting p-type impurity ions using patterned sixth photoresist 28 as a mask.

Figure 9:
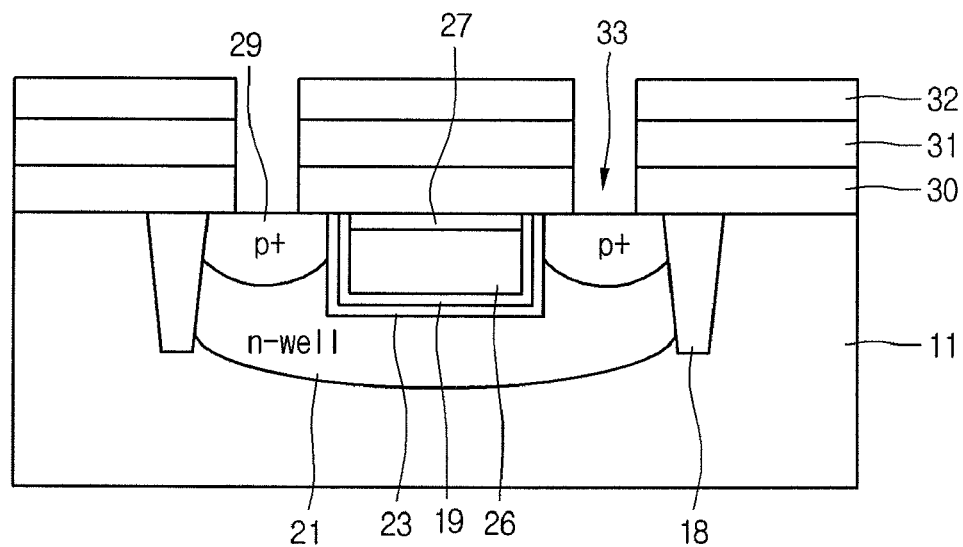

Referring to FIG. 9, sixth photoresist 28 may be removed. First and second interlayer dielectric layers 30 and 31 may be sequentially deposited. Seventh photoresist 32 may be formed on second interlayer dielectric layer 31.

Further, seventh photoresist 32, which may be positioned above source/drain regions 29, may be patterned by an exposing and developing process such that seventh photoresist 32 may be selectively removed. First and second interlayer dielectric layers 30 and 31 may be removed using patterned seventh photoresist 32 as a mask, thereby forming first contact hole 33.

In embodiments source/drain regions 29 may be exposed by first contact hole 33.

Figure 10:
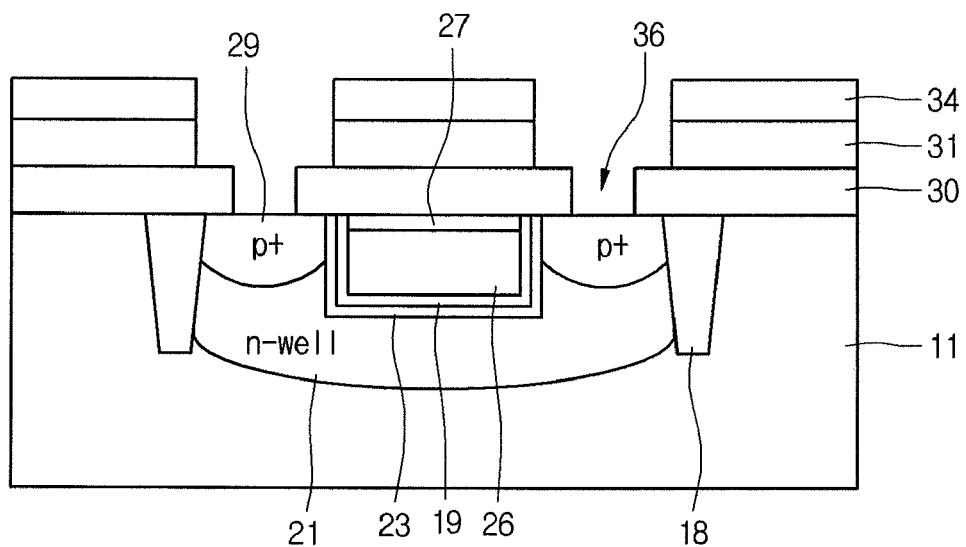

Referring to FIG. 10, seventh photoresist 32 may be removed. An eighth photoresist may be coated on a surface (for example, the entire surface) of semiconductor substrate 11, and eighth photoresist 34 may be patterned to have a width that may be broader than that of first contact hole 33.

Second interlayer dielectric layer 31 may be selectively removed using patterned eighth photoresist 34 as a mask, thereby forming second contact holes 36 such that a dual damascene structure may be formed.

Figure 11:
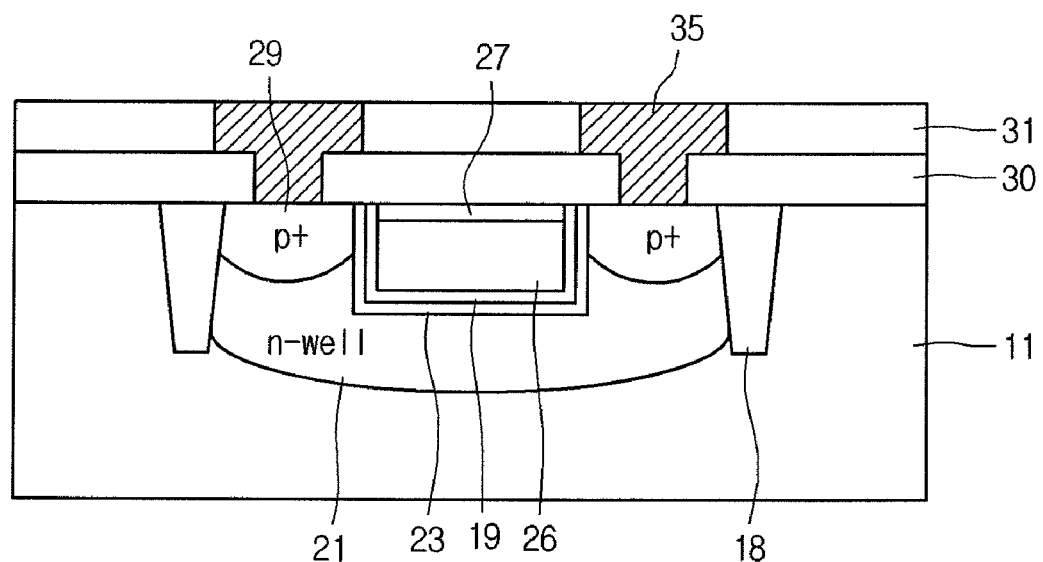

Referring to FIG. 11, eighth photoresist 34 may be removed, and a metal layer may be deposited on a surface (for example, the entire surface) of semiconductor substrate 11. Second contact holes 36 may thus be filled with the metal layer. Further, metal interconnections 35 may be respectively formed within second contact holes 36 by chemical mechanical polishing (CMP) the metal layer to expose interlayer dielectric layer 31. The metal layer may be left only within second contact holes 36.

Referring to FIG. 11, active and field regions may be defined on semiconductor substrate 11 between isolation layers 18.

Further, n-well region 21 may be formed in the active region of semiconductor substrate 11, and a trench may be formed in a prescribed portion of n-well region 21.

Furthermore, gate electrode 26 and cap gate insulating layer 27 may be formed within the trench, and insulating layer pattern 19 may be interposed in an interface between gate electrode 26 and n-well region 21.

In embodiments, gate electrode 26 may be formed at a position lower than the height of a surface of semiconductor substrate 11, and cap gate insulating layer 27, which may be made of insulating material, may be formed on gate electrode 26.

Accordingly, a gate stack according embodiments may be formed in a structure in which the gate stack may be filled within semiconductor substrate 11 so that the integration of semiconductor devices may be more effectively accomplished.

Further, highly concentrated n-type impurity region 23 having a DDD structure may be formed in n-well region 21 adjacent to insulating layer pattern 19, and source and drain regions 29 may be formed in n-well region 21 at both sides of gate electrode 26 through p-type impurity ion implantation.

Furthermore, interlayer dielectric layers 30 and 31 may be on semiconductor substrate 11 including gate electrode 26, and contact holes having a dual damascene structure respectively may be formed in interlayer dielectric layers 30 and 31 on source/drain regions 29, and metal interconnections 35 are respectively formed within the contact holes.

According to embodiments, surfaces of gate electrode 26 and cap gate insulation layer 27 may be formed at the same height as a surface of semiconductor substrate 11, and the height of metal interconnection 36 may be formed to be identical to that of interlayer insulation layers 30 and 31.

In embodiments, a height of gate electrode 26 may be formed to be at a height identical to a surface of semiconductor substrate 11 without forming cap gate insulating layer 27.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a semiconductor substrate having a well region;
   a gate electrode formed within the well region at a prescribed depth;
   a cap gate insulating layer comprising an insulating material formed on a surface of the gate electrode, wherein an upper surface of the cap gate insulating layer is substantially level with a surface of the semiconductor substrate;
   an n-type impurity region and an insulating layer pattern formed between the gate electrode and the well region, wherein the insulating layer pattern is directly on both lateral sides of the gate electrode and the cap gate insulating layer and directly on a bottom surface of the gate electrode, and wherein the n-type impurity region entirely surrounds and contacts the insulating layer pattern;
   source/drain regions formed within the semiconductor substrate at sides of the gate electrode; and
   an interlayer dielectric layer formed over the semiconductor substrate and having metal interconnections formed therein configured to be electrically connected to the source/drain regions, respectively.

2. The device of claim 1, further comprising isolation layers formed on either side of the well region to define an active area, wherein the source/drain regions are formed within the well region.

3. The device of claim 1, wherein the gate electrode is formed below a surface of the semiconductor substrate.

4. The device of claim 1, wherein the n-type impurity region comprises a double doped drain (DDD) structure, and wherein the DDD structure is configured to contact at least a portion of the source/drain regions.

5. The device of claim 4, wherein the insulating layer pattern is formed between the DDD structure and the gate electrode.

6. The device of claim 1, further comprising an insulating layer pattern including an insulating material formed between the gate and the well region.

7. The device of claim 1, wherein the metal interconnections are formed within corresponding contact holes in the interlayer dielectric layer each having a shape of a dual damascene pattern.

8. A method comprising:
   forming a well region within a semiconductor substrate;
   forming first and second trenches in the semiconductor substrate;
   forming an n-type impurity region by implanting dopants into the second trench;
   forming an insulating layer with in the first and the second trenches;
   selectively removing the insulating layer formed within the second trench, thereby forming a third trench with an insulating layer pattern;
   forming a gate electrode on the insulating layer pattern within the third trench;
   forming a cap gate insulating layer over the gate electrode, wherein a surface of the cap gate insulating layer is substantially level with an upper surface of the semiconductor substrate;
   forming source/drain regions within the well at sides of the gate electrode;
   forming an interlayer dielectric layer over the semiconductor substrate;
   forming contact holes in the interlayer dielectric layer; and
   forming metal interconnections within the contact holes through the interlayer dielectric layer, configured to be electrically connected to the source/drain regions, respectively,
   wherein the insulating layer pattern is directly on both lateral sides of the gate electrode and the cap gate insulating layer and directly on a bottom surface of the gate electrode, and wherein the n-type impurity region entirely surrounds and contacts the insulating layer pattern.

9. The method of claim 8, wherein the insulating layer is selectively removed from the second trench such that the insulating layer pattern having a prescribed thickness remains within the second trench.

10. The method of claim 8, wherein each metal interconnection is formed by depositing a metal material such that the corresponding contact hole is filled with the metal material, and performing chemical mechanical polishing with respect to the metal material.

11. The method of claim 8, wherein the gate electrode is formed by depositing a conductive material on the semiconductor substrate including the third trench and performing chemical mechanical polishing (CMP) with respect to the conductive material such that the gate electrode is filled within the third trench.

12. The method of claim 8, wherein the gate electrode is formed entirely beneath a surface of the semiconductor substrate, and wherein the n-type impurity region comprises a Double Doped Drain structure and the n-type impurity region is formed between the gate electrode and the well.

* * * * *